United States Patent [19]

Vu

[11] Patent Number: 5,826,174
[45] Date of Patent: Oct. 20, 1998

[54] METHOD AND APPARATUS FOR IMPROVING DATA TRANSMISSION OVER A WIRELESS SYSTEM BY OPTICAL SPECTRUM POSITIONING

[75] Inventor: Hoai Xuan Vu, Stanton, Calif.

[73] Assignee: Simple Technology, Inc., Santa Ana, Calif.

[21] Appl. No.: 589,884

[22] Filed: Jan. 23, 1996

[51] Int. Cl.[6] ............................... H04N 1/00; H04B 1/26
[52] U.S. Cl. .............................................. 455/42; 455/315
[58] Field of Search ........................... 455/33.1, 42, 314, 455/315, 66, 303, 305, 306, 104, 118, 113; 375/222, 223; 379/98

[56] References Cited

U.S. PATENT DOCUMENTS

| | | | |
|---|---|---|---|
| 4,479,251 | 10/1984 | Dawson | 455/223 |
| 4,520,507 | 5/1985 | Moon | 455/315 |
| 4,553,264 | 11/1985 | Hasegawa et al. | 455/315 |
| 5,386,590 | 1/1995 | Dolan . | |

FOREIGN PATENT DOCUMENTS

| | | | |
|---|---|---|---|
| 4404245814 | 9/1992 | Japan | 455/118 |

*Primary Examiner*—Amelia Au
*Attorney, Agent, or Firm*—Blakely, Sokoloff, Taylor & Zafman

[57] ABSTRACT

The present invention is a method and apparatus for signal conditioning which reduces non-linear distortion caused by RF/FM transmitters by lowering the carrier frequency of the modem transmit signal. This is accomplished by lowering the highest frequency in the input signal to the RF/FM transmitter. In one embodiment, modem datapumps are modified so that the optimal modem carrier frequency is utilized for data modulation. The optimal carrier frequency is computed by placing the lowest frequency component in the transmit spectrum at the low band-edge of the RF channel. In other embodiments, a conventional modem transmit spectrum is shifted to the optimal carrier frequency, which is determined by the method described above. Another aspect of the present invention involves the modification of the receiving modem to operate with both conventional land-line modems and the present invention modified-carrier modems used in conjunction with the cellular telephone network. This is accomplished by implementing energy-correlation filters which determine the frequency band over which the received signal energy is distributed.

3 Claims, 3 Drawing Sheets

5,826,174

METHOD AND APPARATUS FOR IMPROVING DATA TRANSMISSION OVER A WIRELESS SYSTEM BY OPTICAL SPECTRUM POSITIONING

BACKGROUND OF THE INVENTION

1. Field of the Invention

The present invention relates to communication systems, and more particularly to a method and apparatus of increasing data transmission rate over wireless communication systems through the implementation of optimal spectrum positioning.

2. Description of the Related Art

Conventional voice-band modems do not perform well over wireless cellular telephone networks due to numerous factors which contribute to performance degradation in these modems. These factors include: fading, adjacent-channel interference, sudden carrier drop-out due to control information exchange between base stations and mobile telephones (e.g. channel changes, hand-offs during roaming, etc.), and non-linear amplitude distortion associated with the transmission of high signal power.

Of these factors, non-linear amplitude distortion causes the most significant impairment to system performance. Non-linear amplitude distortion is caused by overdriving radio-frequency/frequency modulation (RF/FM) transmitters. A typical RF/FM transmitter includes a high-frequency emphasis filter to effectively reduce the effect of high-frequency noise on the transmitted signal, and a limiter circuit to constrain the transmitted FM spectrum to within the pre-determined bandwidth of the wireless channel. Since high-frequency components of a signal entering a Radio Frequency/Frequency Modulation (RF/FM) transmitter are emphasized, typically at a rate of 6 dB/octave at present, the limiter tends to discriminate against high-frequency components in the transmitted signal spectrum. This results in performance degradation in the modems.

One approach to solving this problem includes lowering the high-frequency energy density in the transmission, as described in U.S. Pat. No. 5,386,590 to Dolan. The Dolan patent describes a system and method for reducing amplitude distortion caused by such a limiter circuit which exists in conventional cellular communication systems. In the Dolan device, the high-frequency energy density in the transmitted signal is limited through the introduction of linear distortion by using a linear low-pass filter. This linear distortion is removed by either a matched high-pass filter, or an adaptive equalizer in the modem receiver. Since most conventional land-line modems rely on the high-frequency portion of the received signal spectrum for timing recovery, any attenuation of high-frequency components in the received signal results in lower probabilities of symbol-timing recovery. As a result, this technique is sub-optimal.

Accordingly, there is a need in the technology for a method of signal conditioning which reduces non-linear distortion caused by RF/FM transmitters without causing high-frequency signal component attenuation.

BRIEF SUMMARY OF THE INVENTION

The present invention is a method and apparatus for signal conditioning which reduces non-linear distortion caused by RF/FM transmitters by lowering the carrier frequency of the modem transmit signal. This in turn lowers the highest frequency in the input signal to the RF/FM transmitter. In one embodiment, modem datapumps are modified so that the optimal modem carrier frequency is utilized for data modulation. The optimal carrier frequency is computed by placing the lowest frequency component in the transmit spectrum at the low band-edge of the RF channel. In other embodiments, a conventional modem transmit spectrum is shifted to the optimal carrier frequency, which is determined by the method described above.

Another aspect of the present invention involves the modification of the receiving modem to operate with both conventional land-line modems and the present invention modified-carrier modems used in conjunction with the cellular telephone network. This is accomplished by implementing energy-correlation filters which determine the frequency band over which the received signal energy is distributed.

DETAILED DESCRIPTION OF THE INVENTION

A. Theory of Operation

Figure 1:
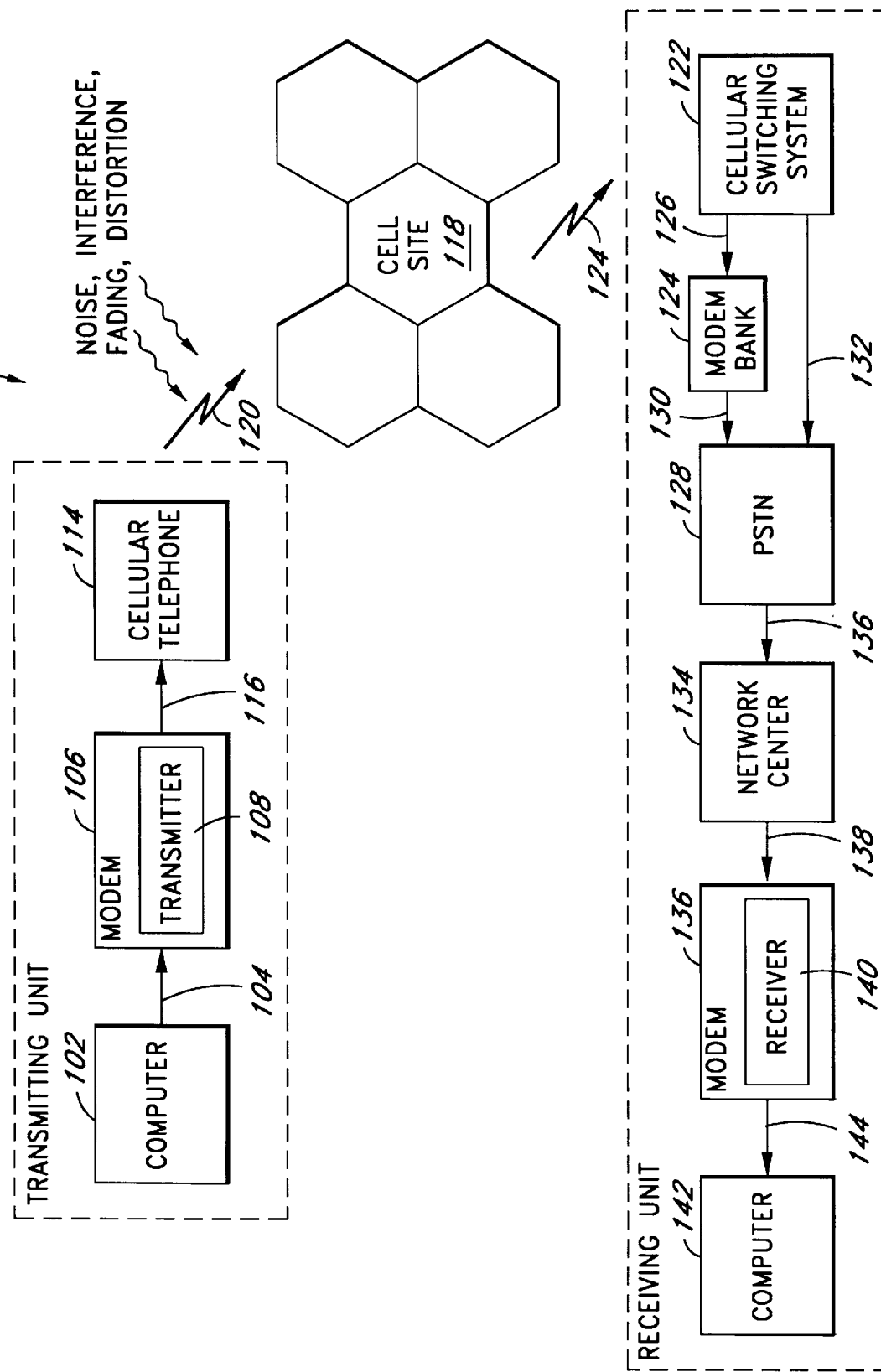
FIG. 1 is a system block diagram of a cellular communication system which implements the present invention.

The present invention provides a technique of signal conditioning which reduces non-linear distortion caused by RF/FM transmitters without causing high-frequency attenuation. In particular, the present invention provides a technique for lowering the carrier frequency used by the modem transmitter. For a given symbol rate, lowering the carrier frequency results in lower high-frequency energy density without compromising spectral integrity of the modem output.

The present invention accomplishes this goal by minimizing the highest frequency in the input signal to the RF/FM transmitter through minimization of the carrier frequency used by the modem transmitter. In one embodiment, modem datapumps are modified so that the optimal modem carrier frequency for RF/FM transmission is utilized. The optimal modem carrier frequency is computed by placing the lowest frequency component in the modem transmit spectrum at the low band-edge of the RF channel. In another embodiment, the normal modem transmit spectrum (after data modulation) is modified (shifted) to the optimal modem carrier frequency, which is determined by the method described above.

Another aspect of the present invention involves the modification of the receiving modem to operate with both conventional land-line modems and modified-carrier modems of the present invention used in conjunction with the cellular telephone network. This is accomplished by implementing energy-correlation filters which determine the frequency band over which the received signal energy is distributed. Detailed descriptions of these aspects of the present invention are provided below.

1. Computing the Optimal Carrier Frequency

To compute the optimal carrier frequency, the following parameters are first defined: the RF channel passband is defined by the interval $[f_l, f_h]$, the modem symbol rate (sometimes also referred to as baud rate) is defined as $f_b$, and the optimal modem carrier frequency is defined as $f_0$. It is known that for a given $f_b$ and $f_0$, the signal spectrum has only significant components in the bands $[f_1, f_2]=[f_0-f_b/2, f_0+f_b/2]$.

the optimal modem carrier frequency $f_0$ may be expressed as follows:

$$f_l = f_1 \Rightarrow f_0 = f_l + \frac{f_b}{2} \tag{1}$$

for example:
where $f_l 0$, and $f_b$=2.4 KHz, $\Rightarrow$ $f_0$=1.2 KHz
and where $f_l$=0.3 KHz, and $f_b$=2.4 KHz, $\Rightarrow$ $f_0$=1.5 KHz 2. Direct Carrier-Frequency Modification Binary data shifted into a typical modem datapump is first randomized and assembled into symbols, or bauds. These symbols are then mapped into a set of quadrature coordinates z(t), which can be viewed as a complex baseband signal consisting of real and imaginary parts z(t)=a(t)+jb(t), pursuant to the governing standard (e.g. V22, V22bis, V32, V32bis, V34, etc.). The result is used to modulate a pair of sinusoids in quadrature at the modem carrier frequency $f_c$ to produce a standard QAM (quadrature-amplitude modulation) signal. This operation can be viewed as a complex multiplication of z(t) and a complex exponential at the carrier frequency $f_c$, i.e.:

$u(t)=x(t)+jy(t)=z(t)\exp(j2\pi f c t)$ $x(t)=Re\{z(t)\exp(j2\pi f_c t)\}=a(t)\cos(2\pi f_c t)-b(t)\sin(2\pi f_c t)$ (2a)

$y(t)=Im\{z(t)\exp(j2\pi f_c t)\}=b(t)\cos(2\pi f_c t)+a(t)\sin(2\pi f_c t)$ (2b)

Only the real part x(t) or the imaginary part y(t) is used for transmission, not both. Without loss of generality, it is assumed that the real part x(t) is used. The modulated signal is then shaped by a Nyquist pulse (typically a square-root-of-raised-cosine bandpass filter) prior to transmission. In some implementations, the baseband signal z(t) is shaped by a Nyquist pulse in the form of a lowpass filter prior to modulating the carrier. The end results are the same.

In a typical implementation using a digital signal processor (DSP) with a fixed sampling rate, the carriers in quadrature are generated by look-up tables. Indices into the table are generated by integrating the (constant) angular velocity of a rotating phasor.

Examples of implementations of direct carrier-frequency modification in a typical modem datapump design include the following:

(1) Modifying the (constant) angular velocity that is used to generate the carrier signal.
(2) In the implementations where the transmit shaping filter is a bandpass filter as described above, the center frequency of the filter must be adjusted to the new carrier frequency $f_0$. In implementations where the shaping filter is a lowpass filter, no adjustment is needed.

B. Implementation

FIG. 1 is a system block diagram of a cellular communication system 100 which implements the present invention. The cellular communication system 100 includes a computer 102 which may include a plurality of peripheral devices, such as a hard disk memory unit, a printer, and a keyboard. The computer 102 communicates with a modem 106 via a communication link 104. The modem 106 includes a transmitter 108. The modem 106 is connected to a cellular telephone 114 via a communications link 116.

The cellular telephone 114 communicates with a cellular site 118 via a radio transmission link 120. The cellular site 118 provides the acquired information to a cellular switching system 122 via a transmission link 124 which may be, for example, comprise a land line or a microwave link. The cellular switching system 122 may be connected to a modem bank 124 via line 126, and then to a Public Switch Telephone Network (PSTN) 128 via line 130. Alternatively, the cellular switching system 122 may transfer information directly to the PSTN 128 via line 132. The PSTN 128 communicates with a central network 134 via a communication link 136. The central network 134 maintains and monitors network operations. The central network 134 is connected to a modem 136 via line 138. The modem 136 includes a receiver 140 and is connected to a computer 142 via a communications link 144.

In operation, the cellular communication system 100 provides bi-directional communications between the computers 102 and the 142. The computer 102 may also have an appropriate interface protocol which allows for interface with the modem 106. In one embodiment, the modem 106 is internal to the computer 102, either by attachment to the mother-board, or by connection with the PCMCIA slot. In another embodiment, the modem 106 is external, and the RS 232 serial port is used to connect the computer 102 with the modem 106. The modem 106 converts digital data output by the computer 102 to analog data suitable for transmission over an analog cellular telephone communication link. The modem 106 also converts incoming analog data into digital data suitable for input to the computer 102.

The cellular telephone 114 includes radio transmitter circuitry which enables it to transmit an analog data radio signal to a local cellular (cell) site (i.e., the cell site 118). The cell site 118 receives the signal provided by the telephone 114 and transmits this signal to the cellular switching system 122 by means of a link 124 which may be a wireline or microwave link. The cellular switching system 122 provides communication signals to the PSTN 128 via communication line 132. Alternatively, the cellular switching system 122 may transfer communication signals to the modem bank 124, where modem and FAX data translation operations, as well as storage and forward functions may be performed. Once the communication signal is provided to the PSTN 128 by either the switching network 122 or the modem bank 124, the PSTN 128 transmits the communication signal in digital format to the network center 134. The network center 134 performs local call routing operations as well as digital to analog conversion. The communication signal is then routed to the modem 136 which included a receiver 140. Subsequently, the communication signal is transmitted to the computer 142 for further processing and display.

It should be noted that if voice information is to be communicated, the parties would simply use the telephone 114, and a telephone (not shown) connected on the receiving end. Furthermore, it should be understood that, although the data communication between the computer 102 and the computer 142 is described as unidirectional (from the computer 102 to the computer 142), the system 100 allows for bi-directional communication. Finally, one of ordinary skill in the art will recognize that either one side or both sides of the cellular communication system 100 can be embodied as a cellular transmitter/receiver. Thus, via the cellular communication system 100, binary data and other information can be transmitted from or to a computer and/or facsimile device by means of radio transmission.

1. Carrier Frequency Modification by Two-Stage Conversion

Figure 2:
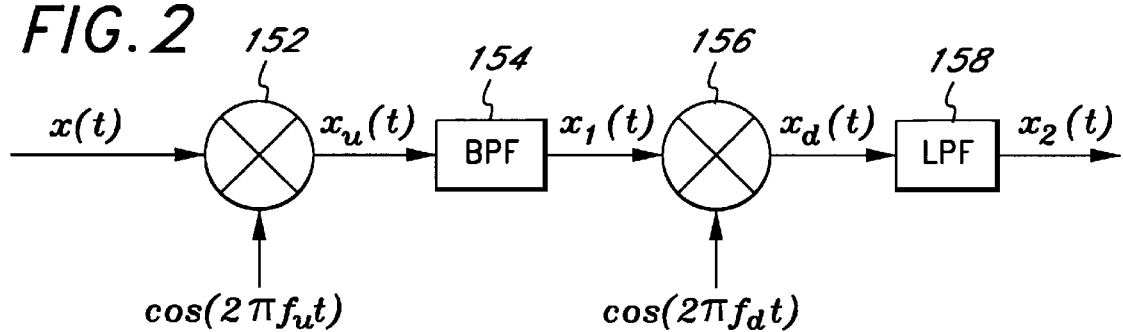
FIG. 2 is a block diagram of the one embodiment of a converter of the present invention utilized by transmitter 108 of FIG. 1.

Because a modern conventional land-line modem typically modulates a low carrier frequency (1700 Hz–1800 Hz) using a fairly high symbol rate ($\geq 2400$ symbols/second), directly shifting carrier frequency by a conventional one-stage down-conversion is not possible without seriously compromising spectrum integrity. To preserve signal integrity, a two-stage conversion approach is required. FIG. 2 is a block diagram of one embodiment of the frequency shifter of the modem transmitter 108 of FIG. 1. The frequency shifter includes a converter 150 which comprises a first multiplier 152, a band pass filter 154, a second multiplier 156 and a low pass filter 158.

The modulated carrier signal x(t) received from the modulator (what would normally be the conventional modem output) is first up-converted to an intermediate frequency (IF). This is done by multiplying the signal x(t) by cos $(2\pi f_u t)$. The multiplication is performed by the first multiplier 152. The resulting signal $x_u(t)$ having upper and lower sidebands is filtered by band pass filter 154 to provide a signal $x_1(t)$, preserving only the upper sidebands. The signal is then down-converted to the desired carrier frequency to obtain the signal $x_d(t)$, also having upper sidebands. This is done by multiplying the $x_1(t)$ with $\cos(2\pi f_d t)$, where $f_d$ is the frequency associated with down conversion. Finally, a low-pass filter 158 isolates the desired spectrum at the new (optimal) carrier frequency for presentation to the RF transmitter by preserving only the desired sidebands to provide the resultant signal $x_2(t)$. The converter 150 may be implemented by either analog or DSP means.

Figure 3A:
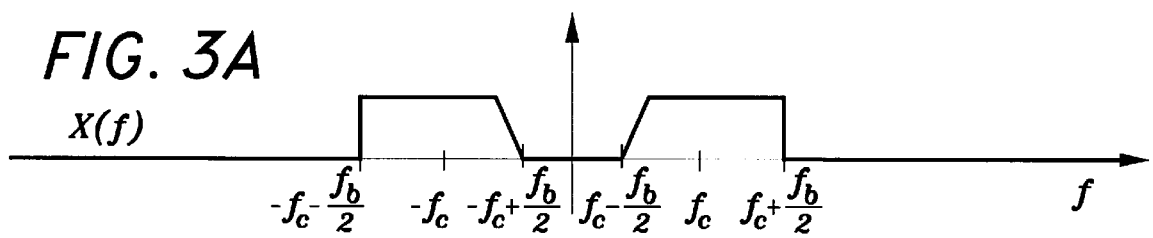
FIG. 3A is a graph illustrating the spectral components of the original modulated carrier signal.
Figure 3B:
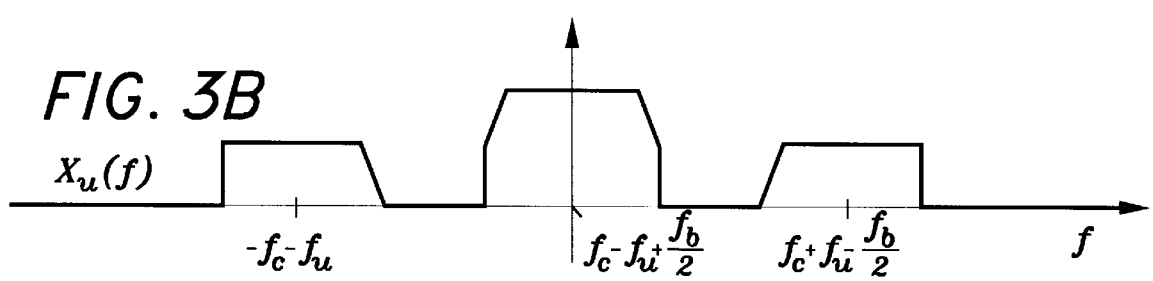
FIG. 3B is a graph illustrating the spectral components of the upconverted modulated carrier signal of FIG. 3A.

FIGS. 3A–3E illustrate the spectral components of the carrier signal in various stages of the conversion process discussed above. In particular, FIG. 3A is a graph illustrating the spectral components of the original carrier signal x(t). FIG. 3B is a graph illustrating the spectral components of the upconverted carrier signal $x_u(t)$. Upon up-conversion, the two components shown in FIG. 3A are shifted to an intermediate frequency. This process results in the addition of spectral components having sum frequencies and difference frequencies which can overlap. This spectral component comprising the overlapping difference frequencies is filtered out by band pass filter 154 to provide the signal $x_1(t)$.

Figure 3C:
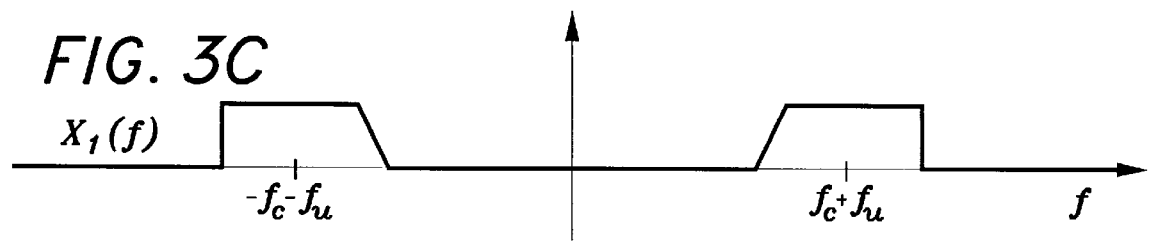
FIG. 3C is a graph illustrating the spectral components of the signal of FIG. 3B after the difference frequency components have been filtered out.
Figure 3D:
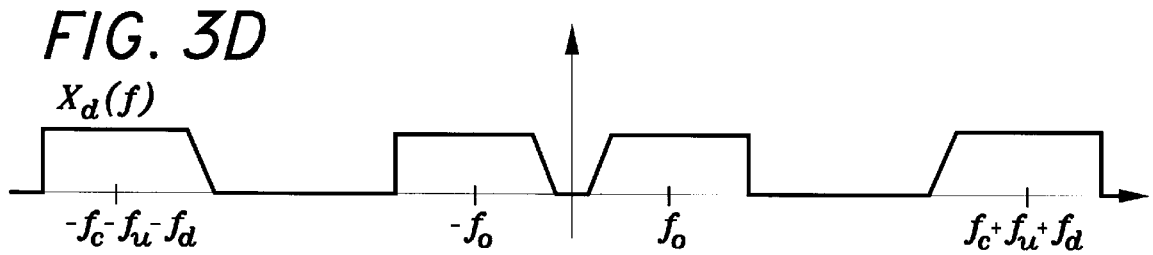
FIG. 3D is a graph illustrating the spectral components of the signal of FIG. 3C after a down-conversion to the optimal carrier frequency.
Figure 3E:
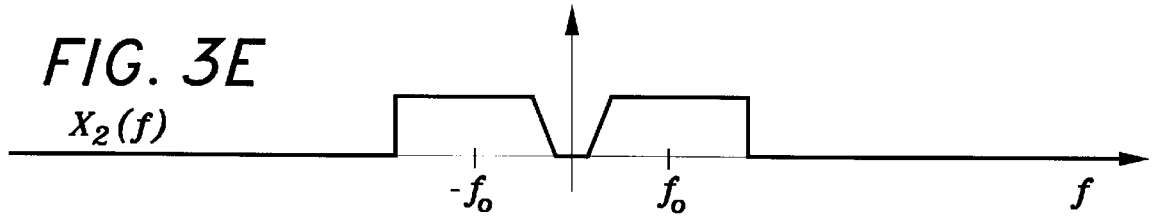
FIG. 3E is a graph illustrating the spectral components of the signal of FIG. 3D after the sum frequency components of the signal have been filtered out.

FIG. 3C is a graph illustrating the spectral components of the upconverted signal $x_1(t)$ after the undesired spectral component has been filtered. FIG. 3D is a graph illustrating the spectral components of the filtered upconverted signal of FIG. 3C after down conversion. Upon down-conversion, additional spectral components which include the sum and difference frequencies of the frequency used for down-conversion appear, with the sum frequency components being filtered out by means of low pass filter 158 to provide the signal $x_d(t)$. FIG. 3E is a graph illustrating the spectral components of the filtered, upconverted, down converted signal of FIG. 3D after the undesired components of the signal have been filtered, so as to provide the resulting signal $x_2(t)$.

From the representation of the signal $x_u(f)$ as shown in FIG. 3, for a given carrier frequency $f_c$ and symbol rate $f_b$, the separation S between the desired and undesired spectral components is given by $$S = \min_{f_u} \left\{ f_c - \frac{f_b}{2} - \left( -f_c + \frac{f_b}{2} \right), f_c + f_u - \frac{f_b}{2} - \left( f_c - f_u + \frac{f_b}{2} \right) \right\} \quad (3)$$

$$S = \min_{f_u} \{2f_c - f_b, 2f_u - f_b\}$$

by inspection of equation (3) it is clear that if $$f_c > f_b/2,$$

and $$f_u > \frac{f_b}{2} \Leftrightarrow S > 0 \quad (4)$$

For a given carrier frequency $f_c$ and symbol rate $f_b$, the maximum separation occurs at $$f_u \geq f_c \Leftrightarrow S = S_{max} = 2f_c - f_b \quad (5)$$

The optimal choice $f_u^*$ is the smallest value of $f_u$ for which $S = S_{max}$, i.e.

$$f_u^* = f_c \quad (6)$$

Given $f_c$, $f_0$ and $f_u$, $$f_d = f_c + f_u - f_0$$

The optimal choice of $f_d$ is $$f_d^* = 2f_c - f_0 \quad (7)$$

Equations (6) and (7) give the optimal choices of the frequencies used in the two-stage conversion scheme shown in FIG. 2. The characteristics of the filters 154 and 158 are as follows:

a. Band-pass Filter 154 Requirements $$\text{Passband Frequencies} = \left[ f_c + f_u - \frac{f_b}{2}, f_c + f_u + \frac{f_b}{2} \right] \quad (8a)$$

$$\text{Stopband Frequencies} = \left[ f_c - f_u + \frac{f_b}{2}, f_c + 3f_u - \frac{f_b}{2} \right] \quad (8b)$$

b. Low-pass Filter 158 Requirements $$\text{Passband Frequencies} = f_0 + \frac{f_b}{2} \quad (9a)$$

$$\text{Stopband Frequencies} = f_c + f_u + f_d - \frac{f_b}{2} \quad (9b)$$

2. Carrier-Frequency Modification by Single-Stage Conversion

Although a single-stage heterodyne conversion is not possible without spectral distortion as discussed earlier, a one-step conversion is possible if the signal is first converted to single-side-band (SSB) format using the Hilbert transformation. Since only the real part of a narrowband complex-analytic bandpass signal is transmitted (equation [2a]), it is a well-known fact that the imaginary part (equation [2b]) of such a signal may be generated by Hilbert-transforming the real part. The spectrum of the reconstructed narrowband complex-analytic bandpass signal consists of a single signal component centered about the carrier frequency, thereby allowing a one-step conversion to the desired optimal carrier frequency. A block diagram of the scheme is given in FIG. 4. Although an analog implementation is possible, a DSP approach is preferable.

Suppose for the moment that G and H are two all-pass filters, with equal group delays, the transfer functions of which are a Hilbert-transform pair. If the input x(t) is given by equation (2a), then the output w(t) is given by $$w(t) = [a(t)\cos(2\pi f_c t) - b(t)\sin(2\pi f_c t)]\cos[2\pi(f_c - f_o)t] + \quad (10a)$$

$$[b(t)\cos(2\pi f_c t) + a(t)\sin(2\pi f_c t)]\sin[2\pi(f_c - f_o)t]$$

$$w(t) = a(t)\cos(2\pi f_o t) - b(t)\sin(2\pi f_o t) = Re\{z(t)\exp(2\pi f_o t)\} \quad (10b)$$

Comparing equations (10b) and (2a), it is apparent that w(t) is indeed generated by shifting the original signal x(t) from the carrier frequency $f_c$ to the optimal carrier $f_0$.

Earlier, the assumption was made that G and H are all-pass filters. This is not necessarily required, however. If G and H are not all-pass filters, then the in-phase (I) and quadrature-phase (Q) components of w(t) are the convolution of the original I and Q components with the impulse response of G and H. This is equivalent to inserting a filter with a transfer function of the magnitude response of G and H into the communications channel.

Figure 4:
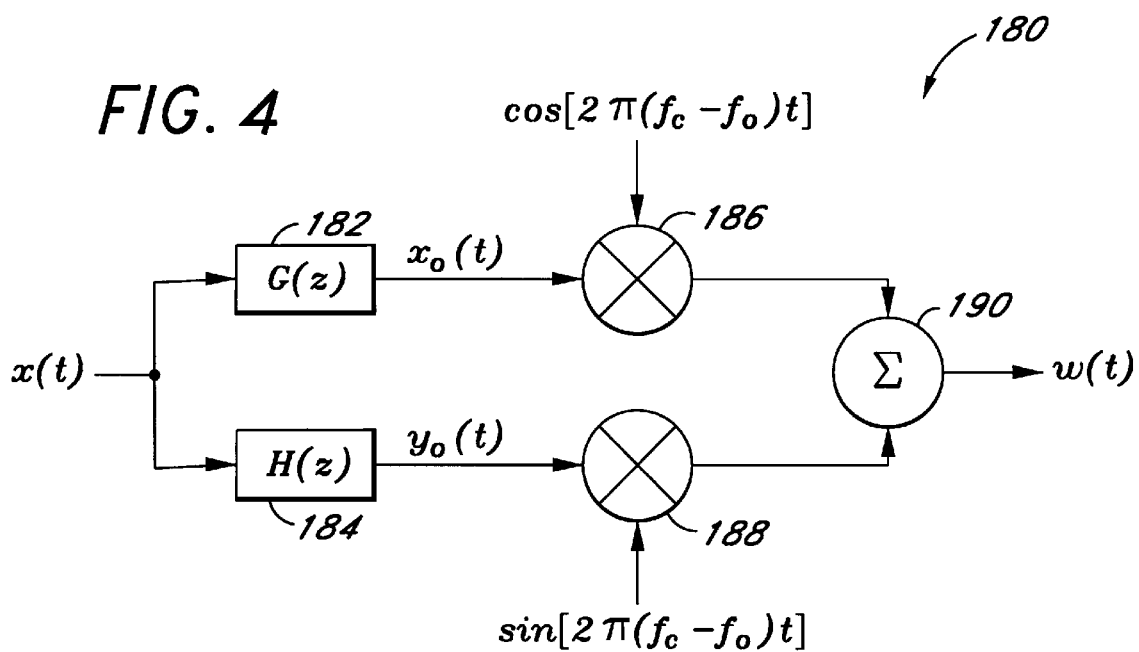
FIG. 4 is a block diagram of another embodiment of the converter of the present invention utilized by transmitter 108 of FIG. 1.

Thus, with reference to FIG. 4, an alternative embodiment of the converter implemented by transmitter 108 includes converter 180. The signal received from the modulator of modem 106 is provided to converter 180, which provides the signal to filters 182 and 184 having a predetermined transfer function. Each of filters 182 and 184 filters the received signal x(t) to provide the filtered signals $x_o(t)$ and $y_o(t)$ respectively. The signal $x_o(t)$ is shifted from the carrier frequency to the optimal frequency by multiplying it by $\cos(2\pi(f_c-f_o)t)$ by means of multiplier 186. Similarly, the signal $y_o(t)$ is shifted to the optimal frequency by multiplying it by $\sin(2\pi(f_c-f_o)t)$ by means of multiplier 188. The shifted pair are then combined (or summed) to produce a resultant frequency-shifted signal w(t).

3. Receiver Adaptation to Modified Carrier Frequency

In order for modem receivers to operate with the modified-carrier transmission techniques discussed above, the receiver should have means to quickly (and, perhaps, coarsely) determine the carrier frequency used by the transmitter during the training pattern.

Figure 5:
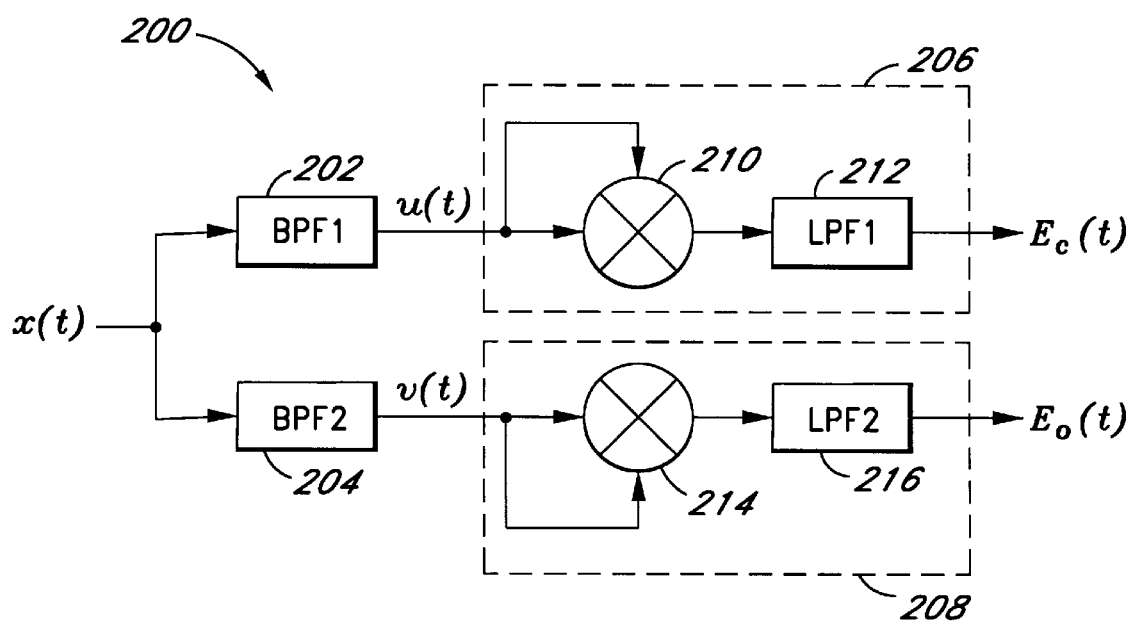
FIG. 5 is a block diagram of one embodiment of the energy-correlation filters utilized by the receiver of FIG. 1.

FIG. 5 is a block diagram of one embodiment of the receiver 140 of FIG. 1. The receiver 140 includes a circuit 200 which provides a means of determining the carrier frequency used by the transmitter 108 which implements the converter 150 or 180. The circuit 200 comprises two band pass filters 202 and 204 and two energy detectors 206 and 208.

The signal x(t) received by the modem 136 is passed through two bandpass filters, 202 and 204 to provide signals u(t) and v(t) respectively. The filter 202 is centered at $f_c$ and the filter 204 is centered at $f_0$. The bandwidths of both filters 202 and 204 is $f_b$. Each filtered signal u(t) and v(t) is then multiplied by itself, i.e. squared, using multiplier 210 and 214, to determine the energy $u_1(t)$ and $v_1(t)$ contained in each filtered signal u(t) and v(t). The resulting signal $u_1(t)$ is filtered by low pass filter 212 to provide a signal representing the average energy $E_c(t)$ carried by the signal centered at $f_c$, while $v_1(t)$ is filtered by filter 216 to provide a signal representing the average energy $E_o(t)$ carried by the signal centered at $f_0$. The filters 212 and 216 are energy averaging filters.

If signal energy $E_c(t)$ in the frequency band around $f_c$ is higher than that in the band around $f_0$, the carrier frequency is determined to be $f_c$. Conversely, if signal energy $E_o(t)$ in the frequency band around $f_0$ is higher than that in the band around $f_c$, then the carrier frequency is determined to be $f_0$. This may be represented by the following expression:

$$f_{carrier} = \begin{cases} f_c; & E_c > E_0 \\ f_0; & E_c < E_0 \end{cases} \quad (11)$$

a. Band-pass Filter 202 Requirement $$\text{Passband Frequencies} = \left[ f_c - \frac{f_b}{2}, f_c + \frac{f_b}{2} \right] \quad (12)$$

b. Band-pass Filter 204 Requirement $$\text{Passband Frequencies} = \left[ f_0 - \frac{f_b}{2}, f_0 + \frac{f_b}{2} \right] \quad (13)$$

c. Low-pass Filters 212, 216 Requirement

Since the low pass filters 212 and 216 are used as energy averaging filters, the filter pole should be very small. Care must be taken in the choice of pole location so as to produce an acceptably short detection time. Lowering the detection time will reduce the probability that the receiver 140 would miss the first part of the training pattern.

Once the carrier frequency of the received signal x(t) is identified, signal recovery is implemented by the receiver 140. This may be accomplished in one of two ways. First, the received signal x(t) may be demodulated by a modem designed to demodulate a modem receive signal having the optimized carrier frequency. Second, one may utilize one of the two techniques discussed earlier in reverse, to shift the carrier frequency of the received signal from the optimized frequency back to the normal modem carrier frequency, prior to providing the received signal to a conventional modem for demodulation.

In summary, the present invention minimizes the high-frequency energy density in the transmission by minimizing the carrier frequency used by the modem transmitter. The simplest implementation is to modify existing modems to operate at the calculated optimal carrier frequency. Absent access to the internal workings of existing modems, a two-stage conversion scheme using conventional heterodyning mixers may be used for carrier shifting of the transmit output of a conventional modem.

In addition, if a digital signal processor is to be used, a one-step conversion method using the Hilbert-transformation is an elegant solution to the carrier shifting problem. Furthermore, energy detectors may be used in the receiver to determine the carrier frequency used by the transmitter. This allows receivers to modify operating parameters to properly demodulate the transmission.

Through the implementation of the principles of the present invention, the performance of conventional land-line modems over the cellular telephone network may be significantly improved. In addition, the present invention eliminates problems created by existing techniques, which introduce linear distortions into the original transmission by use of a low-pass filter to alter the high-frequency components in the modem transmit signal.

The present invention improves data transmission over wireless communication systems such as cellular telephone systems by providing modem transmit signals at a carrier frequency optimized or at least better selected for wireless communication channels than is provided by conventional land line modems. If land line modems are to be used, or at least modems modulating the data on the same carrier as is used in conventional line modems, the present invention results in the shifting of the carrier of a modem transmit signal downward to a more optimal carrier frequency to minimize or reduce distortion in the higher frequency components of the signal. This allows for less distortion during transmission over the wireless channel, and substantially improves recovery accuracy in the receiving modem. In certain protocols the same will result in improved accuracy of the received data, while in a protocol such as Microcom Network Protocol level 10 (MNP10), the reduced error rate can result in the reduction in the percentage of the transmission devoted to error correction, effectively increasing the data communication throughput rate in a modem for a given baseband data rate. Potentially, the present invention allows modems to be designed to operate at a higher baud rate from the optimal frequency than conventional modems, while maintaining or even somewhat improving the data transmission integrity of the channel.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. In a wireless FM communication system having at least one communication channel having an RF communication frequency band, a method of providing a modem carrier $f_0$ modulated by data to provide a modem signal having a predetermined frequency band, the modem carrier $f_0$ being selected to place the low frequency of the frequency band of the modem signal at the low band-edge of the communication channel, comprising the steps of;

(a) providing a modem carrier $f_c$ modulated by data to provide a modem signal the modem signal having a predetermined frequency band centered around the carrier frequency $f_c$; and, (b) shifting the modem signal by a frequency $f_u$ to provide sum and difference frequency bands;

(c) removing one of the sum and difference frequency bands:

(d) shifting the remaining frequency bands to again provide sum and difference frequency bands, one of which is centered around $f_0$ and (e) removing the frequency band not centered around $f_0$ to provide the modem signal having the low frequency at the low band-edge of the communication channel.

2. The method of claim 1 wherein $f_0$ is less than $f_c$.

3. The method of any one of claims 1 or 2 wherein $f_c$ is the carrier frequency of a conventional land line modem.

* * * * *